United States Patent
Chen

(10) Patent No.: US 7,391,408 B1
(45) Date of Patent: Jun. 24, 2008

(54) ADJUSTABLE APPARATUS IN DISPLAY DEVICES FOR AUTOMATIC ADJUSTING BRIGHTNESS

(75) Inventor: Meng-Kun Chen, Hsin-Tien (TW)

(73) Assignee: Lite-On Semiconductor Corp., Taipei (TW)

( * ) Notice: Subject to any disclaimer, the term of this patent is extended or adjusted under 35 U.S.C. 154(b) by 0 days.

(21) Appl. No.: 11/727,564

(22) Filed: Mar. 27, 2007

(51) Int. Cl.
*G09G 3/36* (2006.01)
*H01L 31/00* (2006.01)

(52) U.S. Cl. .............. 345/102; 250/214 A; 250/214 LS; 250/215; 250/216

(58) Field of Classification Search ............. 250/214 A, 250/214 LS, 215, 216, 227, 214; 345/102; 315/247, 246, 149–158
See application file for complete search history.

(56) References Cited

U.S. PATENT DOCUMENTS

| 5,572,074 A | * | 11/1996 | Standley | ..................... 307/117 |
| 5,679,953 A | * | 10/1997 | Ananth et al. | ............ 250/338.1 |
| 6,982,406 B2 | * | 1/2006 | Chen | ........................ 250/214.1 |

* cited by examiner

*Primary Examiner*—Tuyet Vo
(74) *Attorney, Agent, or Firm*—Rosenberg, Klein & Lee

(57) ABSTRACT

An adjustable brightness apparatus includes a light detection unit and a modulation and can automatically adjust the backlight current of a display device based on variable ambient light outside the display device so as to reduce the power consumption. Users can therefore view images shown on the display device more clearly and comfortably.

14 Claims, 4 Drawing Sheets

ADJUSTABLE APPARATUS IN DISPLAY DEVICES FOR AUTOMATIC ADJUSTING BRIGHTNESS

BACKGROUND OF THE INVENTION

1. Field of the Invention

The present invention relates to a display device, and more particularly to an adjustable apparatus in display devices for automatic adjusting brightness.

2. Description of the Prior Art

In the current era, the performance of consumer electronic products such as cell phones, notebooks, etc. is constantly improving, especially when it comes to display devices for consumer electronic products. For example, display devices are offering users ever clearer images and greater usability.

However, it should be noted that the usability of a display device is usually based on the variable ambient light outside the display device. If the illumination of the variable ambient light outside the display device is too high, the backlight of the display device will be too low compared with the current variable ambient light. Consequently, users will need to strain their eyes to watch the images shown on the display device. Conversely, if the illumination of the variable ambient light outside the display device is too low, the backlight of the display device will be too high compared with the current variable ambient light. However, the consequences are the same as users will again not have a positive experience watching the images shown on the display device.

In the prior art, adjustable brightness apparatuses were developed to solve the problem described above. In FIG. 1, a block diagram of the previous adjustable brightness apparatus is shown. The adjustable brightness apparatus 100 includes a light detection unit 1 and a resistance R1 connecting with the light detection unit 1 externally. The light detection unit 1 includes a photo diode D1 and an amplification circuit 10.

The amplification circuit 10 amplifies variable ambient light outside the display device detected by the photo diode D1, and produces a light source signal as a photo-induced current. The light source signal is transformed into an output voltage Vout through the resistance R1. A characteristic curve illustrating the comparison between the variable ambient light and the photo-induced current is shown in FIG. 2.

However, each component of the adjustable brightness apparatuses has its limitations. Hence, the photo-induced current produced by the light detection unit 1 has a switch point C1. When the illumination of the variable ambient light is higher than the maximum level, the photo-induced current does not continually increase and becomes saturated passing the switch point C1.

The characteristic curve in FIG. 2 is divided into a weak light mode I, a normal mode II and a highlight mode III. The weak light mode I is for when users are using the display device at a place full of dark variable ambient light. The normal mode II is for when users are using the display device at a place full of normal variable ambient light. The highlight mode III is for when users are using the display device at a place full of high variable ambient light.

In the previous embodiment, when the variable ambient light is so high that the illumination of the backlight of the display device is not enough, users cannot watch images on the display device comfortably, and the display device will waste power.

SUMMARY OF THE INVENTION

It is the object of the present invention to provide a modulation circuit to adjust the light detection signal outputted by the light detection unit, for further producing a suitable photo-induced current. The display device can produce a corresponding backlight current based on the photo-induced current to drive the display module to display a suitable backlight.

It is another object of the present invention to provide an external control unit to control the photo-induced current according to users' requirements.

It is another object of the present invention that the photo-induced current is low when the variable ambient light is low, the photo-induced current increases as the variable ambient light increases and is lower than the switch point, and the photo-induced current drops to zero gradually when the variable ambient light increases and is higher than the switch point.

It is another object of the present invention that the photo-induced current increases or reduces linearly.

It is another object of the present invention that users can watch the images on display device clearly and comfortably according to adjusting the illumination of the backlight of the display device when the variable ambient light outside the display device changes violently and suddenly.

In order to achieve the above objects, the present invention provides an adjustable brightness apparatus that includes a light detection unit and a modulation circuit.

The light detection unit generates a light source signal after receiving variable ambient light outside the display device. The modulation circuit further controls a photo-induced current generated by the adjustable brightness apparatus, based on the light source signal, wherein the photo-induced current has a switch point.

When variable ambient light outside the display device is less than the switch point, the photo-induced current is low. When variable ambient light outside the display device is higher but still less than the switch point, the photo-induced current becomes higher. When variable ambient light outside the display device is higher and larger than the switch point, the photo-induced current drops to zero. In this embodiment, the photo-induced current increases and reduces linearly.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
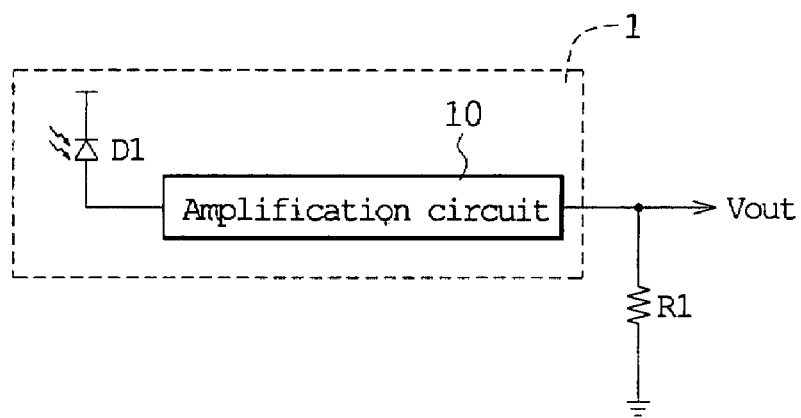
FIG. 1 is a block diagram of the adjustable brightness apparatus of the previous invention.
Figure 2:
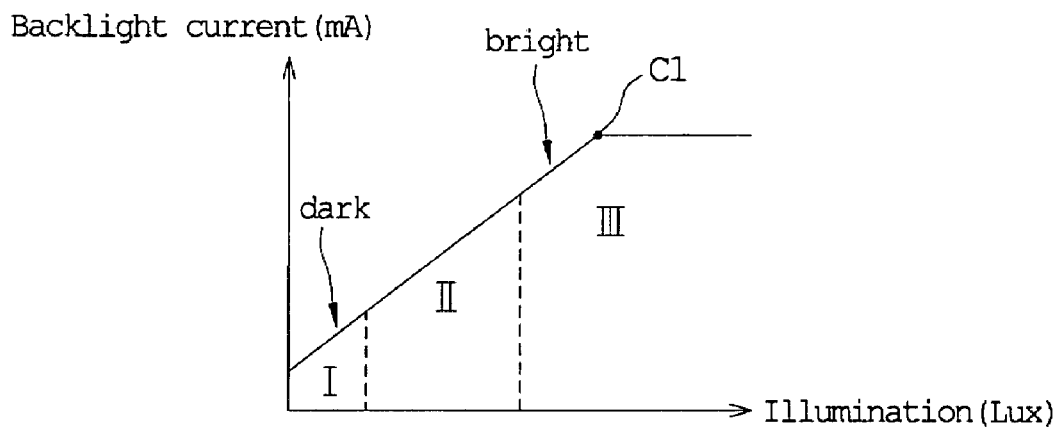
FIG. 2 is a characteristic curve diagram of the comparison between variable ambient light and the photo-induced current of the previous invention.
Figure 3:
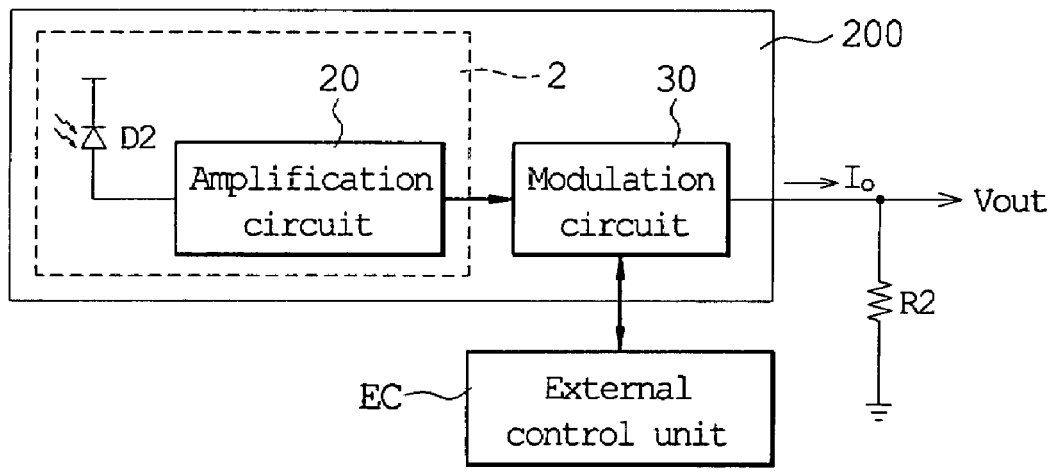
FIG. 3 is a block diagram of the adjustable brightness apparatus of the present invention.

In FIG. 3, a block diagram that illustrates the adjustable brightness apparatus of the present invention is shown. The adjustable brightness apparatus 200 includes a light detection unit 2 and a modulation circuit 30. The light detection unit 2 includes a photo diode D2 and an amplification circuit 20.

The light detection unit 2 detects the intensity of variable ambient light outside a display device through the photo diode D2, and produces a photo current (i.e. a light source signal) based on its physical property after receiving variable ambient light. Then, the amplification 20 amplifies the light source signal so that the display device can use the amplified light source signal to control the backlight. In another embodiment, the light detection unit 2 can be a photo transistor or a photo IC, etc.

The modulation circuit 30 connects to the light detection unit 2 and through an external control unit EC controls the level of the output current Io outputted by the adjustable brightness apparatus 200 based on the intensity of the light source signal. The external control unit EC connects to the modulation circuit 30 externally. The output current Io is a photo-induced current and is used to drive the display device to produce a backlight current, the backlight current can be used to drive a backlight source. If the output current Io becomes too high, the backlight current will also become too high, and the intensity of the backlight source will also become higher. If the output current Io becomes low, the backlight current will also be lower, and the intensity of the backlight source will also become low.

According to above description, the illumination of the backlight source based on the output current Io controlled by the external control unit EC, and the appropriate illumination of the backlight source is not harmful for human eyes. Hence, the adjustable brightness apparatus 200 has to be placed at an appropriate position where variable ambient light can illuminate the display screen of the display device when users view the display screen, for example, the area near the keyboard of notebooks, the area near the display panel or keyboard of cell phones, etc.

Figure 4:
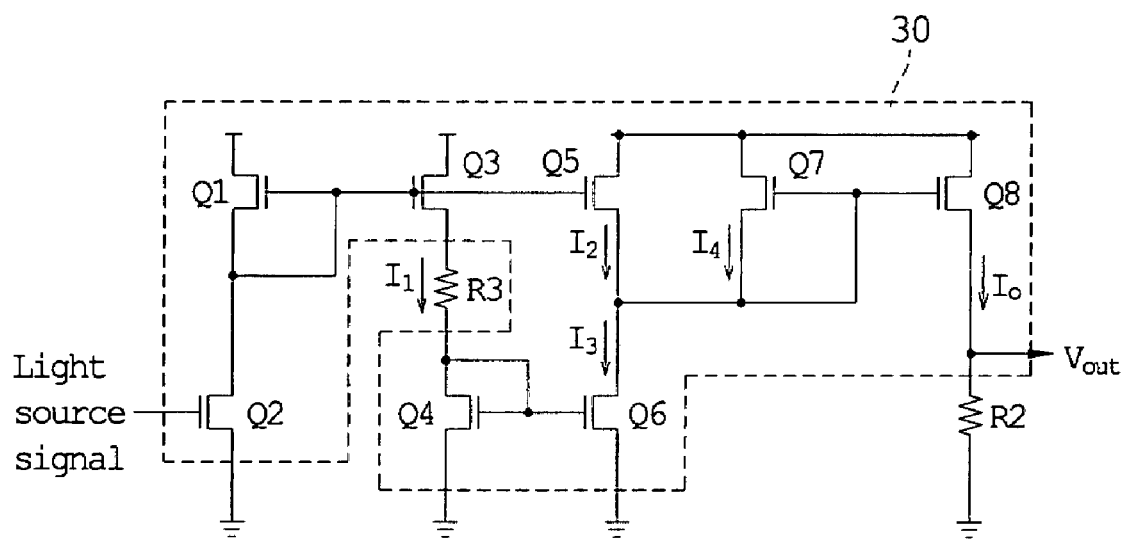
FIG. 4 is a diagram of the modulation circuit of the present invention.

In FIG. 4, a circuit diagram that illustrates the modulation circuit combined with the external control unit of the present invention is shown. The modulation circuit 30 includes four current mirrors. The current mirrors are defined as a first current mirror, a second current mirror, a third current mirror, and a fourth current mirror.

The first current mirror includes the transistors Q1, Q2 and Q3 and produces an output current I1. The second current mirror includes the transistors Q1, Q2 and Q5 and produces an output current I2. The third current mirror includes the transistors Q4 and Q6 and produces an output current I3, wherein the output current I3 is equal to the output current I1 because the output current I1 is the input current of the third current mirror. The fourth current mirror includes the transistors Q7 and Q8 and produces an output current Io that is equal to a drain current I4 of the transistor Q7. The drain current I4 of the transistor Q7 is the difference between the output currents I1 (I3) and I2, so the output current Io is the difference between the Output currents I1 and I2. In addition, the output current I1 has a switch point C21, and the output current I2 has a switch point C22. The output current Io is transformed to an output voltage Vout through the resistance R2 for further driving the display device.

The transistors Q3 and Q5 are designed different ratio so that the current ratio of the first current mirror and the current of the second current mirror are different. After transmitting the light source signal to the modulation circuit 30, the modulation circuit 30 produces the output current I1 through the transistor Q3 of the first mirror current and produces the output current I2 through the transistor Q5 of the second mirror current. Hence, the output currents I1 and I2 are different and have a certain ratio between them, that is, the slope of the output currents I1 and the slope of the output current I2 are different.

Figure 5:
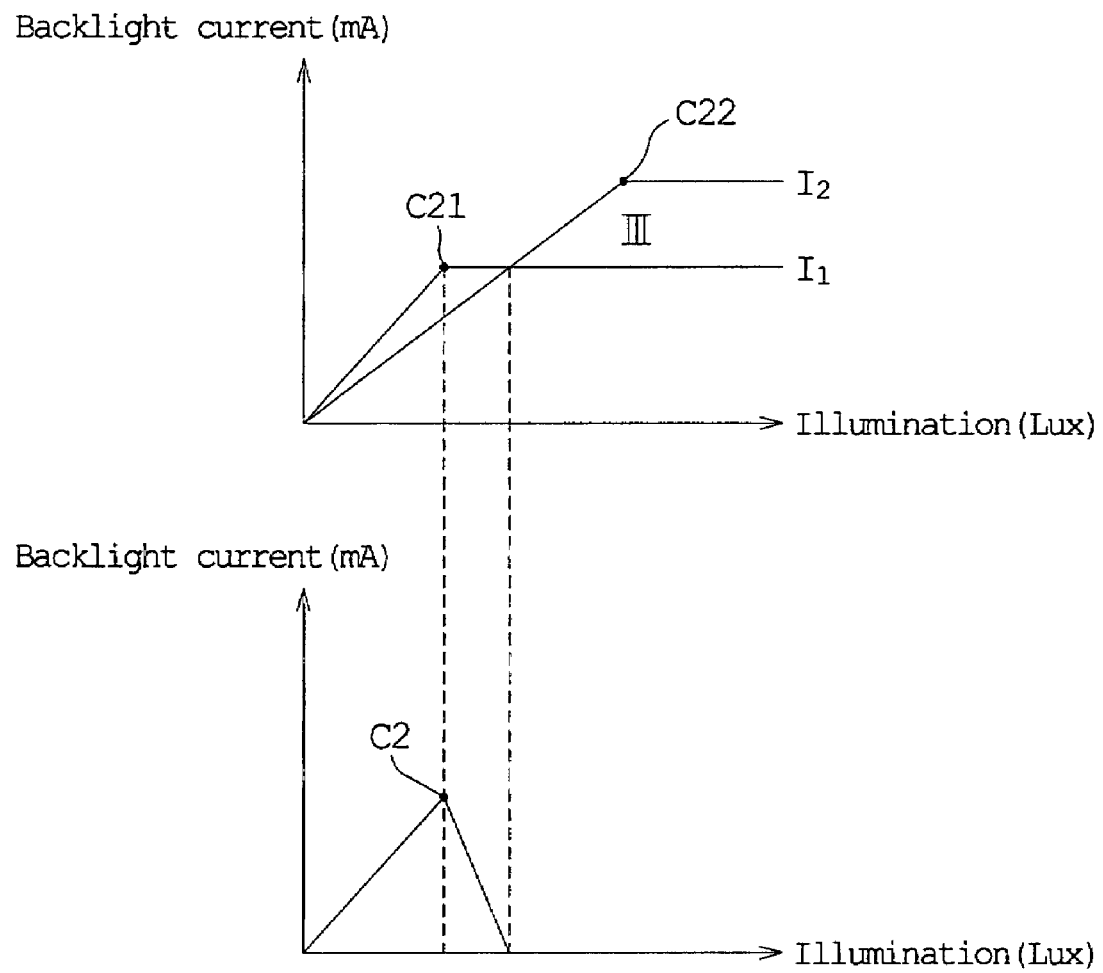
FIG. 5 is a characteristic curve diagram of the comparison between variable ambient light and the backlight current of the present invention.
Figure 6:
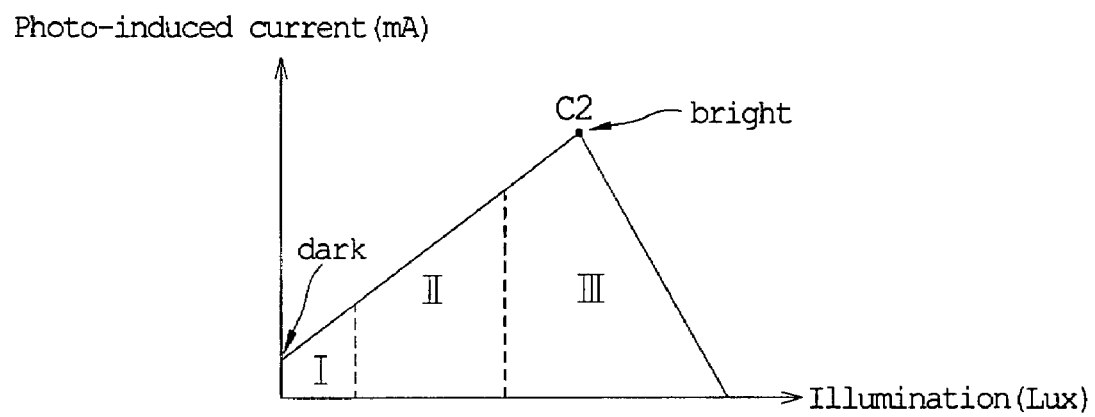
FIG. 6 is a characteristic curve diagram of the comparison between variable ambient light and the photo-induced current of the present invention.

In FIGS. 5 and 6, the manner in which the modulation circuit 30 controls the output voltage Vout is shown. The level of the output current I1 or I2 takes is directly proportional to the illumination of variable ambient light outside the display device. However, the performance of the adjustable brightness apparatus is limited by its circuit characteristics. Hence, after the illumination of brightness ambient light is greater than the switch points C21 and C22, the output currents I1 and I2 do not continuously increase based on increased illumination, but enter in a saturation point.

If the output current I2 is less than the output current I1 (or the output current I3), and the output current I1 is not at the saturation point (or above the switch point C21), the drain current I4 will not be zero, and the transistors Q7 and Q8 will be on. Based on the transistors Q7 and Q8 being on, the photo-induced current is equal to the difference between the output currents I1 and I2 and increases linearly. Moreover, the photo-induced current (Io) is transformed to the output voltage Vout through the resistance R2, and the output voltage Vout increases linearly. The photo-induced current can be used to drive the display device to generate the corresponding backlight current.

If the output current I2 is less than the output current I1 (I3), and the output current I1 is at the saturation point (at the switch point C21), the drain current I4 will not be zero, and the transistors Q7 and Q8 will be on. Based on the transistors Q7 and Q8 being on, the photo-induced current (Io) is the difference between the output currents I1 and I2 and reduces linearly. The output voltage Vout reduces linearly after passing the switch point C2.

If the output current I2 is equal to the output current I1 (or the output current I3), and the output current I1 is at the saturation point, the transistors Q7 and Q8 will be cut-off. After the transistors Q7 and Q7 are cut-off, the photo-induced current (Io) is cut off, and the output voltage Vout is zero.

If the output current I2 is above the output current I1 (I3), and the output currents I2 have been at the saturation point, the transistors Q7 and Q8 will have been cut-off. Based on the transistors Q7 and Q8 cut off, both the photo-induced current and the output voltage Vout are zero.

In this embodiment, the photo-induced current produced by the adjustable brightness apparatus 200 increases or reduces linearly. The photo-induced current is small when the illumination of variable ambient light outside the display device is low, and the photo-induced current is large when the illumination is high but less than the switch point C2. Otherwise, the photo-induced current drops to zero gradually when the illumination of variable ambient light is high and greater than the switch point C2. Hence, if the variable ambient light outside the display device changes substantially, users will be able to clearly and comfortably watch images on the display device after tuning the backlight of the display device.

In addition, a curve illustrating the photo-induced current compared with the illumination of variable ambient light outside the display device is shown. The curve includes three operation modes, and the operation modes include a weak light mode I, a normal mode II and a highlight mode III.

The weak light mode I is for when users are using the display device at times or places of dusky variable ambient light. The normal mode II is for when users are using the display device at times or places of normal variable ambient light. The highlight mode III is for when users are using the display device at times or places of high variable ambient light.

The switch points C21 and C22 can be controlled by the external control unit EC, and the switch point C21 influences the switch point C2. Hence, the external unit EC can control the switch point C2, wherein the external control unit EC is a resistance R3 as shown in FIG. 4. In this embodiment, the external control unit can be a variable resistance, a constant resistance, or other type impedance, etc.

In the preferred embodiment of the present invention, the adjustable brightness apparatus 200 is configured in a transflective type display device. Based on the characteristic of the transflective type display device, the transflective type display device will get into the transmission mode if the variable ambient light outside the display device is dusky, and will get into the reflection mode if the variable ambient light outside the display device is bright.

In the transmission mode, the backlight module of the display device can drive the display device through the photo-induced current to produce the corresponding backlight current so as to drive the backlight module. The driven backlight module can control its illumination so that users can watch images on the display device comfortably. In the reflection mode, the display device can produce the corresponding backlight current based on the reflection of variable ambient light outside the display device and to drive the backlight module. The driven backlight module may illustrate appropriate backlight for users, and then allows users to watch images clearly and comfortably. According to this embodiment, the present invention reduces power use.

In another embodiment, the display device can be a transmission type display device, or a reflection type display device, etc.

The advantage of the present invention is which the invention provides a modulation circuit and an external control unit. Thus, the invention can based on users' requirements adjust the light source signal provided by the light detection unit to generate a suitable photo-induced current. The display device can provide a corresponding backlight current based on the photo-induced current to drive the backlight module for further illuminating suitable light.

Another advantage of the present invention is which the photo-induced current increases or reduces linearly. Thus, users can watch the images on display device clearly and comfortably according to adjusting the illumination of the backlight of the display device when the variable ambient light outside the display device changes violently and suddenly.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An adjustable brightness apparatus, comprising: a light detection unit detecting variable ambient light for further producing a light source signal; and a modulation circuit connecting with the light detection unit and converting the light source signal to two output currents for further controlling a photo-induced current of the adjustable brightness apparatus based on the output currents, the photo-induced current has a switch point, said current increases with the variable ambient light before reaching the switch point, but begins dropping to zero after reaching the switch point.

2. The adjustable brightness apparatus according to claim 1, wherein the output currents change with the intensity of variable ambient light.

3. The adjustable brightness apparatus according to claim 1, wherein the photo-induced current is produced by converting the difference between the output currents.

4. The adjustable brightness apparatus according to claim 1, wherein each output current has a corresponding slope.

5. The adjustable brightness apparatus according to claim 1, wherein the modulation circuit comprising a plurality of mirror currents and the current ratios of the portion of the mirror currents are different, hence, the output currents produced by the corresponding mirror currents with various current ratios are different.

6. The adjustable brightness apparatus according to claim 1, further comprising an external control unit that connects with the modulation circuit so as to control a switch point of the photo-induced current based on the request of a user.

7. The adjustable brightness apparatus according to claim 6, wherein the external control unit is a certainty resistance or a variable resistance.

8. A display device comprises the adjustable brightness apparatus of claim 1, wherein the adjustable brightness apparatus obtains the light source signal produced from variable ambient light outside the display device through the light detection unit and converts the light source signal to the output currents through the modulation circuit for further controlling the photo-induced current based on the output currents, the display device automatically adjusts the illumination of the display device based on the photo-induced current, the photo-induced current has a switch point, the photo-induced current becomes higher with the variable ambient light when dropping below the switch point but drops to zero when passing above the switch point.

9. The display device according to claim 8, wherein the display device is a transflective display device.

10. The display device according to claim 8, wherein the output currents are changed based on the variable ambient light detected by the light detection unit.

11. The display device according to claim 8, wherein the photo-induced current is the difference between the output currents.

12. The display device according to claim 8, wherein the modulation circuit comprises a plurality of current mirrors, the portion of the current mirrors has various current ratios so that the output currents are different.

13. The display device according to claim 8, further comprising an external control unit for connecting with the modulation circuit and controlling a switch point of the photo-induced current based on users' requests.

14. The display device according to claim 13, wherein the external control unit is a constant resistance or a variable resistance.

* * * * *